US011469760B2

(12) United States Patent
Ucar

(10) Patent No.: US 11,469,760 B2
(45) Date of Patent: Oct. 11, 2022

(54) HIGH SPEED TRANSMITTER

(71) Applicant: ADVANCED MICRO DEVICES, INC., Santa Clara, CA (US)

(72) Inventor: Talip Ucar, Sunnyvale, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/823,048

(22) Filed: Mar. 18, 2020

(65) Prior Publication Data

US 2020/0220547 A1 Jul. 9, 2020

Related U.S. Application Data

(62) Division of application No. 15/476,203, filed on Mar. 31, 2017, now Pat. No. 10,630,293.

(51) Int. Cl.
*H03K 19/0185* (2006.01)

(52) U.S. Cl.
CPC .......................... *H03K 19/018521* (2013.01)

(58) Field of Classification Search
CPC ...... H03F 3/45; H03F 3/45071; H03F 3/4513; H03F 3/45125; H03F 3/45134; H03F 2203/45582; H03F 2203/45274; H03K 19/018521; H01F 29/08
See application file for complete search history.

(56) References Cited

U.S. PATENT DOCUMENTS

| | | | | |
|---|---|---|---|---|
| 4,161,040 A * | 7/1979 | Satoh | ...................... | G11C 11/34 326/62 |
| 4,401,901 A * | 8/1983 | Ochi | .................... | H03K 5/2418 326/62 |
| 4,668,919 A * | 5/1987 | de Weck | ............. | H03F 3/45381 330/253 |
| 4,843,261 A * | 6/1989 | Chappell | .................. | G11C 8/10 326/97 |
| 4,864,165 A * | 9/1989 | Hoberman | ........ | H03K 19/17708 324/73.1 |
| 5,663,915 A * | 9/1997 | Mobley | ................ | H03K 5/2481 327/54 |
| 5,739,721 A * | 4/1998 | Brehmer | ............... | H03F 3/3001 330/253 |
| 5,764,097 A * | 6/1998 | Whitfield | ............... | G11C 5/143 365/185.23 |
| 5,784,384 A * | 7/1998 | Maeno | ................... | H03K 3/037 714/726 |

(Continued)

*Primary Examiner* — James M Perez

(57) ABSTRACT

A single stage transmitter that operates at high speed is configured to operate as a driver in write mode and a termination in read mode. The driver configuration includes two circuits. The first circuit includes a PMOS cross-coupled device and a PMOS cascode circuit. The second circuit includes a NMOS cross-coupled device and a NMOS cascode circuit. The PMOS cross-coupled device and the NMOS cross-coupled device is connected in series by alternating current (AC) coupling capacitors. The termination configuration includes a third circuit including MOSFET transmission gates and an inverter controlled by a termination mode enable signal. In write mode, the third circuit of the single stage transmitter is turned off and the first and second circuits are operational. In read mode, the first and second circuits of the single stage transmitter are inactive and the third circuit is operational.

21 Claims, 2 Drawing Sheets

(56) References Cited

U.S. PATENT DOCUMENTS

| | | | | |
|---|---|---|---|---|
| 5,805,021 | A * | 9/1998 | Brehmer | H03F 3/45076 330/253 |
| 5,821,800 | A * | 10/1998 | Le | H03K 17/102 327/437 |
| 5,892,371 | A * | 4/1999 | Maley | H03K 19/00315 326/83 |
| 5,969,542 | A * | 10/1999 | Maley | H03K 17/102 326/17 |
| 6,054,888 | A * | 4/2000 | Maley | H03K 19/00315 327/321 |
| 6,198,686 | B1 * | 3/2001 | Takita | G11C 8/18 365/230.06 |
| 6,201,429 | B1 * | 3/2001 | Rosenthal | H03K 19/018521 326/62 |
| 6,249,153 | B1 * | 6/2001 | Moraveji | H03F 3/45269 327/563 |
| 6,378,008 | B1 * | 4/2002 | Gradinariu | G11C 7/1048 710/5 |
| 6,407,579 | B1 * | 6/2002 | Goswick | H04N 21/43615 326/63 |
| 6,707,755 | B1 * | 3/2004 | Somasekhar | G11C 5/145 365/230.06 |
| 6,738,302 | B1 * | 5/2004 | Parris | G11C 7/065 365/208 |
| 6,766,222 | B1 * | 7/2004 | Duley | G06F 1/266 307/41 |
| 6,768,352 | B1 * | 7/2004 | Maher | H04L 25/0292 326/86 |
| 6,847,555 | B2 * | 1/2005 | Toda | G11C 16/0483 365/185.11 |
| 7,075,842 | B2 * | 7/2006 | Tzartzanis | G11C 11/412 365/207 |
| 7,205,820 | B1 * | 4/2007 | Yeung | H03K 3/356165 327/333 |
| 7,227,400 | B1 * | 6/2007 | Gillespie | H03K 19/00315 327/333 |
| 7,359,275 | B1 * | 4/2008 | Wu | G11C 11/413 365/154 |
| 7,486,571 | B2 * | 2/2009 | Kitagawa | G11C 7/067 365/189.16 |
| 7,714,612 | B1 * | 5/2010 | Pertijs | H03K 19/018585 326/82 |
| 7,915,921 | B1 * | 3/2011 | Roo | H03K 3/356121 326/83 |
| 7,986,165 | B1 * | 7/2011 | Lin | H03K 19/01728 326/63 |
| 8,077,530 | B2 * | 12/2011 | Ishikura | G11C 8/16 365/51 |
| 8,253,441 | B1 * | 8/2012 | Roo | H03K 3/356121 326/87 |
| 8,354,874 | B1 * | 1/2013 | Ucar | H03F 1/0261 327/108 |
| 8,400,857 | B2 * | 3/2013 | Redman-White | G11C 7/062 365/207 |
| 8,411,603 | B2 * | 4/2013 | Kong | H04R 3/005 370/290 |
| 8,513,981 | B2 * | 8/2013 | Liu | H03F 3/45632 327/65 |
| 8,564,357 | B2 * | 10/2013 | Kimoto | H03K 3/356069 327/333 |
| 8,742,790 | B1 * | 6/2014 | Roo | H03K 3/356121 326/83 |
| 9,224,324 | B2 * | 12/2015 | Nadiguebe | G09G 3/3433 |
| 9,325,277 | B1 * | 4/2016 | Bekele | H03B 5/1253 |
| 9,325,546 | B1 * | 4/2016 | Mobin | H04L 7/0079 |
| 9,455,713 | B1 * | 9/2016 | Kadkol | H03K 19/018514 |
| 9,515,605 | B1 * | 12/2016 | Madala | H03B 5/368 |
| 9,647,644 | B2 * | 5/2017 | Kim | H03K 19/0002 |
| 9,703,208 | B2 * | 7/2017 | Wang | G02F 1/017 |
| 9,755,621 | B1 * | 9/2017 | Sinha | H03K 19/018521 |
| 9,847,839 | B2 * | 12/2017 | Gopalakrishnan | H04L 7/0079 |
| 9,893,730 | B1 * | 2/2018 | Ucar | H04L 25/49 |
| 9,985,665 | B1 * | 5/2018 | Salib | H03K 19/0175 |
| 10,122,392 | B2 * | 11/2018 | Paraschou | H03H 11/52 |
| 10,204,666 | B2 * | 2/2019 | Tsukada | G11C 7/1087 |
| 10,218,444 | B2 * | 2/2019 | Gopalakrishnan | H04L 25/49 |
| 10,530,325 | B1 * | 1/2020 | Gonzales | H04L 25/0292 |
| 10,630,293 | B2 * | 4/2020 | Ucar | H03K 19/018521 |
| 10,840,960 | B1 * | 11/2020 | Al-Shyoukh | H03F 3/3001 |
| 10,861,564 | B2 * | 12/2020 | Lin | G11C 7/1006 |
| 10,878,860 | B1 * | 12/2020 | Gupta | G06F 13/4086 |
| 10,878,899 | B1 * | 12/2020 | Islam | G11C 5/147 |
| 10,879,859 | B1 * | 12/2020 | Wyse | H03F 3/45098 |
| 11,139,843 | B1 * | 10/2021 | Li | H04B 1/04 |
| 2002/0021605 | A1 * | 2/2002 | Harada | G11C 29/24 365/201 |
| 2003/0020544 | A1 * | 1/2003 | Behzad | H03F 1/3211 330/254 |
| 2005/0116740 | A1 * | 6/2005 | Elbe | G06F 13/4027 326/86 |
| 2005/0180224 | A1 * | 8/2005 | Tzartzanis | G11C 7/062 365/189.09 |
| 2005/0207228 | A1 * | 9/2005 | Yamashita | B82Y 10/00 |
| 2006/0018494 | A1 * | 1/2006 | Van Halteren | H04R 25/554 381/171 |
| 2006/0061415 | A1 * | 3/2006 | Bhattacharjee | H03F 3/45183 327/563 |
| 2006/0188043 | A1 * | 8/2006 | Zerbe | H04L 27/01 375/233 |
| 2007/0076512 | A1 * | 4/2007 | Castro | G11C 8/10 365/230.06 |
| 2008/0025113 | A1 * | 1/2008 | Kitagawa | G11C 11/4097 365/207 |
| 2008/0036536 | A1 * | 2/2008 | Khorramabadi | H03B 5/1228 330/252 |
| 2008/0157816 | A1 * | 7/2008 | Yamashita | H03K 19/094 326/68 |
| 2008/0211563 | A1 * | 9/2008 | Inaba | H03K 19/00376 327/333 |
| 2008/0231568 | A1 * | 9/2008 | Chen | G09G 3/346 345/84 |
| 2009/0039916 | A1 * | 2/2009 | Buchmann | G11C 7/1051 326/38 |
| 2009/0086563 | A1 * | 4/2009 | Morein | G11C 8/06 365/230.06 |
| 2009/0108903 | A1 * | 4/2009 | Bailey | H03K 3/356182 327/333 |
| 2009/0167405 | A1 * | 7/2009 | Suryanarayana | H03K 3/35613 327/333 |
| 2009/0257287 | A1 * | 10/2009 | Searles | G06F 13/4243 365/189.09 |
| 2009/0257294 | A1 * | 10/2009 | Searles | G06F 13/4243 330/253 |
| 2009/0259872 | A1 * | 10/2009 | Searles | G11C 7/1066 713/400 |
| 2011/0050746 | A1 * | 3/2011 | Tsuchi | G09G 3/20 327/333 |
| 2011/0299351 | A1 * | 12/2011 | Schultz | H03K 19/17744 365/219 |
| 2012/0182060 | A1 * | 7/2012 | Rana | H03K 3/356165 327/333 |
| 2012/0224405 | A1 * | 9/2012 | Tanaka | G11C 11/415 365/72 |
| 2012/0287733 | A1 * | 11/2012 | van Winkelhoff | G11C 7/1075 365/189.16 |
| 2013/0002300 | A1 * | 1/2013 | Fiedler | H03K 19/096 326/97 |
| 2013/0007500 | A1 * | 1/2013 | Fiedler | G06F 1/08 713/501 |
| 2013/0094680 | A1 * | 4/2013 | Allen | H04B 5/0075 704/500 |
| 2013/0147445 | A1 * | 6/2013 | Levesque | G05F 1/595 323/271 |
| 2013/0321026 | A1 * | 12/2013 | Rao | H03K 19/018521 327/333 |
| 2013/0343139 | A1 * | 12/2013 | Evans | G11C 8/18 365/194 |

(56) References Cited

U.S. PATENT DOCUMENTS

| | | | |
|---|---|---|---|
| 2014/0210517 A1* | 7/2014 | Schrom | H03K 19/018521 |
| | | | 326/80 |
| 2014/0244880 A1* | 8/2014 | Soffer | G06F 3/0227 |
| | | | 710/300 |
| 2015/0109865 A1* | 4/2015 | Gulati | G11C 7/12 |
| | | | 365/189.02 |
| 2015/0318030 A1* | 11/2015 | Wilson | G06F 13/4273 |
| | | | 711/106 |
| 2015/0357013 A1* | 12/2015 | Park | G11C 7/12 |
| | | | 365/203 |
| 2016/0161862 A1* | 6/2016 | Wang | G03F 7/70291 |
| | | | 355/18 |
| 2016/0218753 A1* | 7/2016 | Fiedler | H03K 19/0005 |
| 2016/0218896 A1* | 7/2016 | Fiedler | H04L 25/4902 |
| 2016/0315641 A1* | 10/2016 | Raghavan | H03F 3/2173 |
| 2017/0117898 A1* | 4/2017 | Lee | H03K 19/018521 |
| 2017/0139866 A1* | 5/2017 | Wallace | G06F 13/4027 |
| 2017/0185556 A1* | 6/2017 | Büttner | G06F 1/3287 |
| 2017/0215006 A1* | 7/2017 | van Nieuwkerk | H03F 1/3205 |
| 2017/0257168 A1* | 9/2017 | Gopalakrishnan | H04L 7/0087 |
| 2017/0353188 A1* | 12/2017 | Saeki | H03F 3/301 |
| 2018/0131443 A1* | 5/2018 | Gopalakrishnan | H03L 7/23 |
| 2018/0159703 A1* | 6/2018 | Chattopadhyay | H04L 25/0284 |
| 2018/0287718 A1* | 10/2018 | Ucar | H03K 19/018521 |
| 2019/0149238 A1* | 5/2019 | Gopalakrishnan | |
| | | | H03K 19/018521 |
| | | | 398/136 |
| 2019/0260363 A1* | 8/2019 | Kashihara | H03K 3/356113 |
| 2019/0334491 A1* | 10/2019 | Schober | H03K 19/00384 |
| 2020/0220547 A1* | 7/2020 | Ucar | H03K 19/018521 |

\* cited by examiner

HIGH SPEED TRANSMITTER

CROSS-REFERENCE TO RELATED APPLICATIONS

The present application is a divisional application of U.S. patent application Ser. No. 15/476,203, entitled "HIGH SPEED TRANSMITTER" and filed on Mar. 31, 2017, the entirety of which is incorporated by reference herein.

BACKGROUND

Transmitters use a number of stages to achieve high speed data output and reduce reflection at a receiver. In multi-stages, transmitters serialize data, shift the voltage of a data signal from one voltage domain to another by a process known as level shifting, and send data into the channel. For example, in a four-stage configuration, a first stage level shifts a clock or clock and data from a low-power supply domain to a higher power supply domain, a second stage serializes the data, a third stage sends the serialized data through a pre-driver and a fourth stage, a final driver, sends data into a channel. In another two-stage configuration, a first stage level shifts serialized data from a low supply domain to a higher supply domain, and a second stage drives the data into a channel.

BRIEF DESCRIPTION OF THE DRAWINGS

For a better understanding of the disclosure and the various implementations described herein, reference is now made to the following brief description, taken in connection with the accompanying drawings and detailed description, which show at least one exemplary implementation.

DETAILED DESCRIPTION

The present disclosure provides a single stage transmitter that operates in a write mode and a read mode. In a write mode, the single stage transmitter inputs data from a serializer, level-shifts the data from a lower supply domain to a higher supply domain and outputs a high-speed data into a channel. In a read mode, the single stage transmitter is configured as a termination circuit to match the impedance of the channel and to reduce reflection at a receiver.

Figure 1:
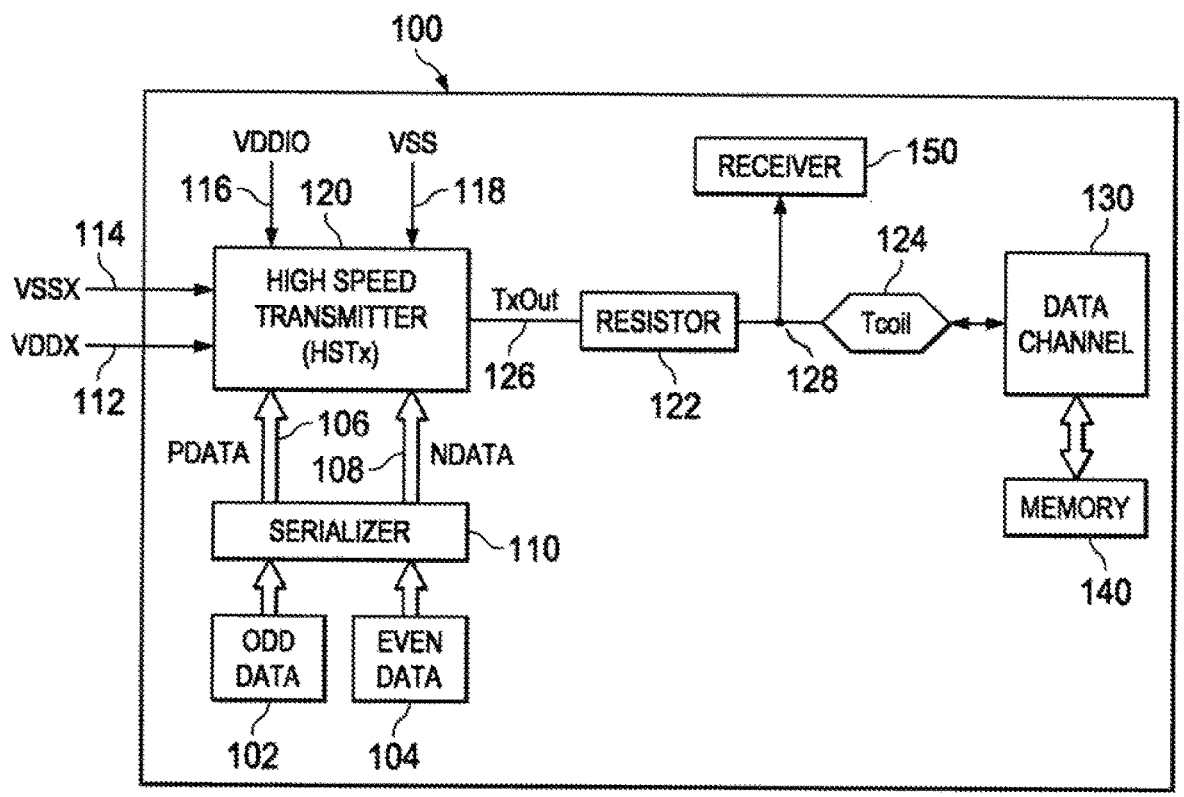
FIG. 1 illustrates an exemplary high speed data link system in accordance with illustrative implementations of the disclosure.

Turning first to FIG. 1, an exemplary high speed data link system in accordance with illustrative implementations of the disclosure is illustrated. A high speed data link system can be used between two subsystems, for example, without limitation, a graphics subsystem that transfers data at a high speed to and from a memory. In one implementation, high speed data link system 100 might be configured to operate in a write or transmission mode. In another implementation, high speed data link system can be configured to operate in a read mode. In transmission mode, High Speed Transmitter (HSTx) 120 inputs data from Serializer 110 and drives data at a high frequency to data channel 130. In another implementation, high speed data link system 100 can be configured to operate in a read or reception mode. In read mode, data channel 130 sends data from memory 140 to receiver 150 and HSTx 120 is configured to add to the impedance of the system to reduce reflection at the receiver 150.

Turning first to the operation in a write mode, Serializer 110 inputs data streams from different sources and combines the data. In one implementation, serializer 110 can input odd_data 102 and even_data 104. Serializer 110 outputs data to HSTx 120. Serializer 110 can output differential data signals, PData 106 and NData 108. Differential signals are equal but complementary signals that transmit information at a same time. Differential data enables greater noise immunity and a stronger data signal. However, in some implementations, the output is single-ended.

HSTx 120 inputs the differential data from Serializer 110. In one implementation, HSTx 120 inputs two separate streams of differential data PData 106 and NData 108. HSTx 120 also inputs supply voltages VDDIO 116 and VSS 118. VDDIO 116 and VSS 118 can be generated external to the high speed data link system 100 or by an internal power supply in the high speed data link system 100. In one implementation, VDDIO 116 has a value of, for example, without limitation, 1.35 volts. In one implementation, VSS 118 is considered as ground or zero volts.

HSTx 120 can also input one or more externally generated bias voltages such as, for example, VDDX 136 and VSSX 138, to define a level of gate voltages within the circuit. In one implementation, VDDX 136 and VSSX 138 are generated by diodes. In another implementation, VDDX 136 and VSSX 138 is generated by programmable reference generators, such as, for example, a regulator. HSTx 120 level shifts data input from the Serializer 110 and drives a stream of digital data TxOut 126 out at a higher voltage to a data channel 130.

HSTx 120 might need to achieve a certain impedance and linearity as data is driven to Data Channel 130. Resistor 122 is included in the high speed data link system 100 to adjust the output impedance to match the impedance of data channel 130 and improve linearity. T-Coil 124 is also included as part of high speed data link system 100 to reduce capacitance on the data line and improve bandwidth of the data in order to enable high speed data output to data channel 130. Data channel 130 transmits data to a memory 140. Memory can be any type of storage device including, without limitation, volatile memory or non-volatile memory, such as, static random access memory (SRAM) or dynamic random access memory (DRAM).

In a read mode, HSTx 120 is configured as termination and is not operative to send data to data channel 130. Instead, in read mode, Data Channel 130 transmits data to Receiver 150 from memory 140. HSTx 120 adds to the resistance load seen by the Receiver at a node 128.

Figure 2:
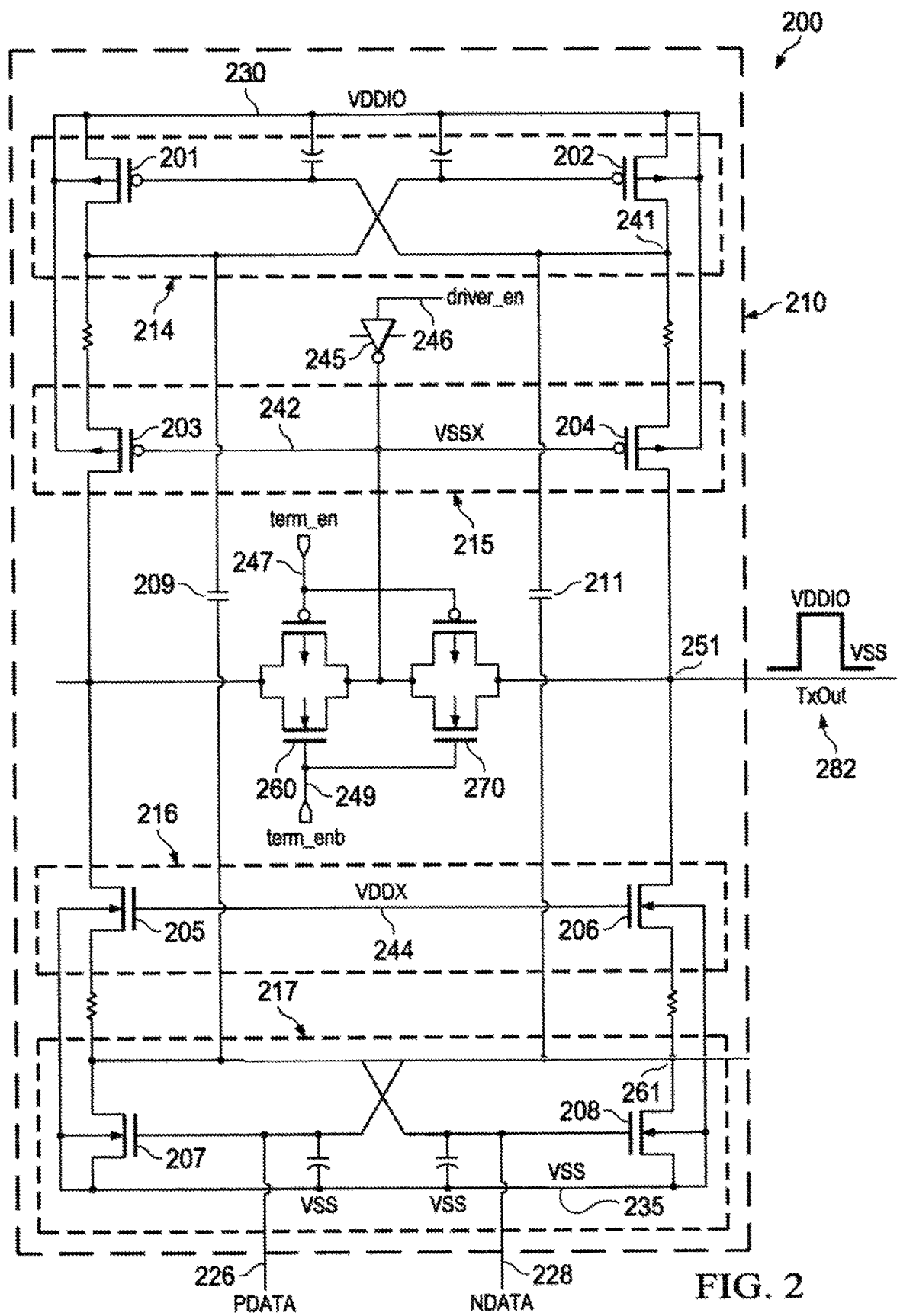
FIG. 2 illustrates a circuit diagram of the high speed transmitter of the high speed data link system of FIG. 1 in accordance with an illustrative implementation of the disclosure.

Referring now to FIG. 2, a circuit diagram of the HSTx 120 of FIG. 1 in accordance with an illustrative implementation of the disclosure is illustrated. In circuit diagram 200, PData 226 and NData 228 is sent differentially to the HSTx 210. PData 226 and NData 228 are input first to NMOS cross-coupled device 217 and to PMOS cross-coupled device 214 through alternating current (AC) capacitors 209 and 211. NMOS cross-coupled device 212 consists of NMOS transistors 207 and 208. AC coupling capacitors 209 and 211 are situated between the NMOS cross-coupled device 212 and the PMOS cross-coupled device 214. The AC coupling capacitors 209 and 211 enable the PMOS cross-coupled device 214 to transition data in tandem or similar to the NMOS cross-coupled device 217.

An NMOS cascode device 216 is situated in parallel to NMOS cross-coupled device 217. PMOS cascode device 215 is situated in parallel to PMOS cross-coupled device 214. A bias voltage VSSX 242 can be applied to the gate of PMOS transistors 203 and 204 of PMOS cascode device 215. Similarly, a bias voltage VDDX 244 can be applied to the gate of NMOS transistors 205 and 206 of NMOS cascode device 216.

Turning now to the operation of circuit 200, for ease of illustration purposes, one side of HSTx 210 is referenced in illustrating the circuit operation, and that same operation applies to the mirror side of the HSTx 210. During a write operation, HSTx 210 drives a high speed data signal TxOut 282 on a voltage rail that swings between supply voltage VDDIO 230 and a ground VSS 235. PMOS transistors 203 and 204 of PMOS cascode device 215 and NMOS transistors 205 and 206 of NMOS cascode device 216 are high voltage (HV) MOSFETS. In operation, data that is a logic "1" is inputted at PData 226 and NData 228 of HSTx 210. In some implementations, PData 226 and NData 228 are input from a domain that is at a lower voltage that HSTX 210. A lower voltage is considered to be around zero to 0.85 Volts. NMOS transistor 207 turns on while NMOS transistor 208 is turned off. Node 261 is set to logic "1" or 0.85 Volts. NMOS cascode device 216 amplifies the voltage value at its source node 261. Thus, logic "1" is amplified to the supply voltage value of VDDIO at node 251. Thus, HSTx 210 drives VDDIO 230 on TxOut 282.

The PMOS cross-coupled device 214 recognizes the logic "1" across AC coupling capacitors 209 and 211. PMOS transistor 202 of PMOS cross-coupled device 214 is switched on while PMOS transistor 201 is switched off and node 246 is set to a logic "1" voltage value. PMOS transistor 202 drives node 246 with VDDIO 230. PMOS cascode device 215 and NMOS cascode 216 act as amplifiers that reflect the logic value at the source nodes of their transistors. Thus, HSTx 210 drives VDDIO 230 on TxOut 282. In summary, in this implementation, driving a logic "1" onto PData 226 and NData 228 causes the HSTx 210 to drive an output signal voltage VDDIO 230 on TxOut 282.

Conversely, data that is a logic "0" might be input to HSTx 210 at PData 226 and NData 228. Logic "0" means that the input at PData 226 is pulled to ground or a value of zero volts. The logic "0" input to HSTx 210 is first input to NMOS cross-coupled device 217. NMOS transistor 207 switches off and NMOS transistor 208 switches on. Since NMOS transistor 208 is turned on, node 261 is set to VSS 235. NMOS cascode device 216 amplifies the value VSS 235 at its source node 261. Thus, VSS 235 is reflected at node 251 and VSS 235 drives TxOut 282.

The PMOS cross-coupled device 214 recognizes the logic "0" across AC coupling capacitors 209 and 211. PMOS transistor 202 switches off while PMOS transistor 201 is turned on. Node 246 is set to voltage value of VSS 235 modulated by a bias voltage, VSSX 247, the gate-to-source voltage across PMOS transistor 204. PMOS cascode device 215 and NMOS cascode device 216 act as amplifiers that reflect the logic value being driven by the source nodes of their transistors. Thus, PMOS cascode transistor 204 of PMOS cascode device 215 reflects and amplifies the voltage value at node 251. Thus, node 251 is set to a value of VSS 235. To summarize, in this implementation, driving a logic "0" to HSTx 210 causes the HSTx 210 to drive a voltage of VSS 235 to node 251 and signal TxOut 282.

During a write operation, mode signal driver_en 246 is activated to enable the operation of the PMOS cascode transistors 203 and 204. Complimentary mode signals term_en and term_enb are disabled so transmission gates 260 and 270 are switched off. During a read operation, mode signal drive_en 246 is disabled so that PMOS cascode transistors 203 and 204 are pulled high to deactivate these transistors. Complimentary mode signals term_en 247 and term_enb 249 are enabled so transmission gates 260 and 270 are switched on creating a low resistance path between the output TxOUT 282 and VDDIO 230 to enable the HSTx 210 to serve as termination.

Figure 3:
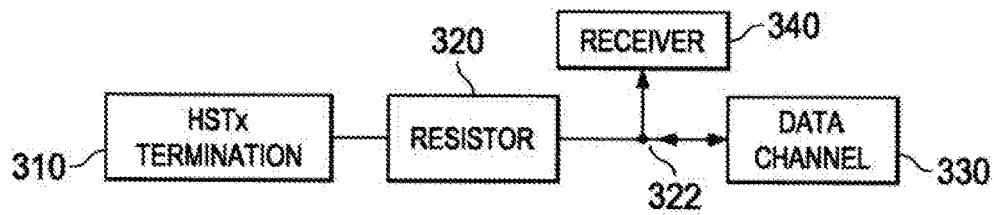
FIG. 3 illustrates a representation of the operation of the high speed data link system in a read mode in accordance with an illustrative implementation of the disclosure.

Referring now to FIG. 3, a representation of the operation of the high speed data link system in a read mode in accordance with an illustrative implementation of the disclosure is illustrated. Data can be transmitted through data channel 330 to Receiver 340. In sending data to Receiver 340, the impedance of the data channel 330 is matched to avoid reflection at the receiver and to achieve a particular termination. The impedance is matched by programming the amount of resistance load experienced by Receiver 340 at node 322. In addition, the resistance load can be achieved by addition of an optional resistor 320 to improve linearity of termination. In some implementations, the value of the resistance of the optional resistor is at least 20 ohms. The resistance load can also be achieved by setting a mode bit to disable the HSTx driver and enable HSTx to operate as a passive resistive termination load. In some implementations, the HSTx termination 310 is at least 40 ohms.

Figures 4A, 4B:
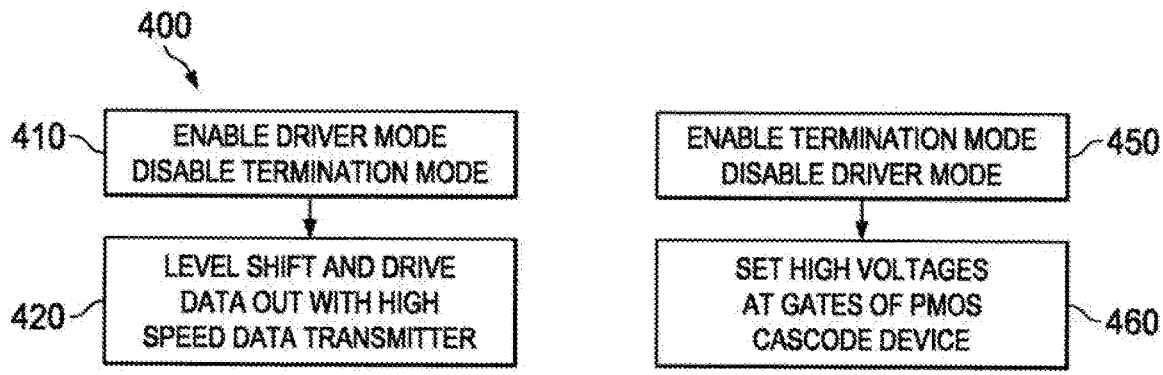
FIG. 4, consisting of FIG. 4A and FIG. 4B, illustrates a method of configuring the high-speed transmitter of the high speed data link system in accordance with an illustrative implementation of the disclosure.

Turning now to FIG. 4, a method of configuring the high-speed transmitter of the high speed data link system is illustrated in accordance with an illustrative implementation of the disclosure. In one implementation, the HSTx is configured to operate in a driver mode. In driver mode, data is driven out to a channel. In another implementation, the HSTx is configured to operate in a termination mode. In termination mode, the driver mode is disabled and the HSTx is operative as a passive element, such as a resistor, in series with a channel. One or more mode bits can be set in a subsystem in which the HSTx is implemented to operate to the HSTx in a driver mode or a termination mode.

Flowchart 400 illustrates the method. In flowchart 400, at 410, a mode is set to enable the driver mode of the HSTx and disable a termination mode. The driver mode of the HSTx uses a level shifter to shift data input from a low voltage data to a high voltage domain and also to drive the data out to a data channel. At 420, based on enabling the driver mode, serialized data that is input from a low voltage domain is shifted to a high voltage domain by a level shifter and driven to a data channel. At 450, a mode is set that disables the driver mode of the HSTx and enables the termination mode of the HSTx. At 460, based on enabling the termination mode, the MOSFET transistors that drive the channel are turned off and HSTx is operative as a resistive load to a receiver to which the channel is sending data.

In some implementations, certain aspects of the techniques described above are implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium might be in source code, assembly language code, object code, or other instruction format that is interpreted or otherwise executable by one or more processors.

A computer readable storage medium can include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium can be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

The various implementations of the present disclosure provide a high speed transmitter that features a single stage which is configured to level shift data from a low supply voltage domain to a higher supply voltage domain and also drives the level shifted data out to a channel. The high speed transmitter is advantageous in enabling level shifting and driving of data into a channel in one stage rather than two or three stages.

Note that not all the activities or elements described above in the general description are required, that a portion of a specific activity or device might not be required, and that one or more further activities can be performed, or elements included, in addition to those described. Still further, the order in which activities are listed are not necessarily the order in which they are performed. Also, the concepts have been described with reference to specific implementations. However, one of ordinary skill in the art appreciates that various modifications and changes can be made without departing from the scope of the present disclosure as set forth in the claims below.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims. Moreover, the particular implementations disclosed above are illustrative only, as the disclosed subject matter can be modified and practiced in different but equivalent manners apparent to those skilled in the art having the benefit of the teachings herein. No limitations are intended to the details of construction or design herein shown, other than as described in the claims below. It is therefore evident that the particular implementations disclosed above can be altered or modified and all such variations are considered within the scope of the disclosed subject matter. Accordingly, the protection sought herein is as set forth in the claims below.

What is claimed is:

1. A high speed data link system comprising:
   a serializer that generates data signals in a first voltage domain;
   a transmitter coupled to the serializer that receives the data signals and outputs a data signal in a second voltage domain that is different from the first voltage domain, wherein the transmitter outputs the data signal to a data channel while shifting a voltage level of the data signal from the first voltage domain to the second voltage domain;
   a data channel associated with the transmitter that receives the data signal;
   a memory associated with the data channel;
   a receiver;
   a resistor connected in parallel to one end of a node of the receiver; and
   a T-coil in parallel to another end of the node of the receiver, wherein the memory drives data to the receiver through the data channel in a read mode, and wherein the transmitter is a single stage.

2. The high speed data link system of claim 1, wherein the serializer generates data signals that are differential.

3. The high speed data link system of claim 1, wherein the transmitter is configured to operate as a driver of output data to the data channel in a write mode.

4. The high speed data link system of claim 3, wherein the transmitter is configured to operate as a termination circuit of the receiver in a read mode.

5. A single stage transmitter, comprising:
   a first circuit, a second circuit and a third circuit;
      wherein each of the first circuit and second circuit is operative to respectively drive data in a write mode from the single stage transmitter to a data channel, and
   wherein the third circuit is operative as a termination circuit in a read mode.

6. The single stage transmitter of claim 5, wherein the first circuit comprises:
   a P-type MOSFET cross-coupled device; and
   a PMOS cascode device connected in series to the P-type MOSFET cross-coupled device and to a first bias voltage.

7. The single stage transmitter of claim 6, wherein the second circuit comprises:
   a N-type MOSFET cross-coupled device in parallel with the P-type MOSFET cross-coupled device; and
   a NMOS cascode device connected in series to the N-type MOSFET cross-coupled device and a second bias voltage.

8. The single stage transmitter of claim 7, further comprising:
   a pair of alternating current (AC) capacitors, each capacitor of the pair of AC capacitors coupled between the P-type MOSFET cross-coupled device of the first circuit and the N-type MOSFET cross-coupled device of the second circuit.

9. The single stage transmitter of claim 8, wherein the third circuit comprises:
   a CMOS transmission gate connected between a drain and gate of the PMOS cascode device; and
   an inverter associated with the CMOS transmission gate that drives a mode enable signal.

10. The single stage transmitter of claim 9, wherein the P-type MOSFET cross-coupled device comprises a first PMOS transistor and a second PMOS transistor, and wherein the N-type MOSFET cross-coupled device comprises a first NMOS transistor and a second NMOS transistor.

11. The single stage transmitter of claim 10, wherein the first PMOS transistor and the second PMOS transistor each comprise a source connected to a first input power supply, a gate connected to complementary output nodes and a drain connected to a gate terminal of a first PMOS transistor of the PMOS cascode device; and the second PMOS transistor comprises a source connected to the first input power supply.

12. The single stage transmitter of claim 11, wherein the PMOS cascode device comprises:
a terminal of a first cascode PMOS transistor connected to a drain of the first PMOS transistor, a terminal of a second cascode PMOS transistor connected to a drain of the second PMOS transistor and a gate of the first cascode PMOS transistor connected to the first bias voltage.

13. The single stage transmitter of claim 12, wherein the NMOS cascode device comprises a terminal of the first cascode PMOS transistor connected to a drain of the first NMOS transistor, a terminal of a second cascode NMOS transistor connected to a drain of the second NMOS transistor and a gate of the first cascode PMOS transistor connected to the first bias voltage.

14. The single stage transmitter of claim 5, wherein the first circuit and second circuit are further operative to drive the data in the write mode from the single stage transmitter to the data channel while a voltage level of a data signal associated with the data is shifted from a first voltage domain to a second voltage domain.

15. A method of configuring a high speed transmitter, comprising:

in response to setting a driver mode bit, level shifting data received from a serializer from a low supply domain to a high supply domain;

driving out the data to a data channel, the data channel being associated with the high speed transmitter that receives the data, wherein a memory is associated with the data channel and a receiver is connected to a resistor, the resistor and a T-coil being connected to a node of the receiver; and in response to setting a termination mode bit, setting gates of PMOS cascode devices in the high speed transmitter to a high voltage, wherein the termination mode bit is operative to enable the high speed transmitter as a termination.

16. The method of claim 15, wherein the memory drives data to a receiver through the data channel in a read mode.

17. The method of claim 16, wherein the serializer generates data signals that are differential.

18. The method of claim 16, wherein the high speed transmitter is a single stage.

19. The method of claim 18, wherein the high speed transmitter is configured to operate as a driver of output data to the data channel in a write mode.

20. The method of claim 19, wherein the high speed transmitter is configured to operate as a termination circuit of the receiver in a read mode.

21. The method of claim 19, wherein the T-coil is connected in parallel to one end of the node of the receiver and the resistor is connected in parallel to another end of the node of the receiver.

* * * * *